US012575116B2

(12) United States Patent
Sivaram et al.

(10) Patent No.: US 12,575,116 B2
(45) Date of Patent: Mar. 10, 2026

(54) INTEGRATED MEMORY AND CONTROL DIES

(71) Applicant: Sandisk Technologies, Inc., Milpitas, CA (US)

(72) Inventors: Srinivasan Sivaram, Los Gatos, CA (US); Jayavel Pachamuthu, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 253 days.

(21) Appl. No.: 18/358,638

(22) Filed: Jul. 25, 2023

(65) Prior Publication Data

US 2024/0276740 A1 Aug. 15, 2024

Related U.S. Application Data

(60) Provisional application No. 63/484,588, filed on Feb. 13, 2023.

(51) Int. Cl.
*G11C 11/34* (2006.01)
*G11C 11/00* (2006.01)
(Continued)

(52) U.S. Cl.
CPC ............ *H10B 80/00* (2023.02); *G11C 11/005* (2013.01); *H01L 24/08* (2013.01);
(Continued)

(58) Field of Classification Search
CPC ....... H10B 80/00; G11C 11/005; H01L 24/08; H01L 25/0652; H01L 25/0657;
(Continued)

(56) References Cited

U.S. PATENT DOCUMENTS 9,311,232 B2 4/2016 Asnaashari et al.
9,899,347 B1 2/2018 Mostovoy et al.
(Continued)

FOREIGN PATENT DOCUMENTS

CN 114822630 A 7/2022
WO 2015/147868 A1 10/2015

OTHER PUBLICATIONS

Hybrid Memory Cute Consortium, Hybrid Memory Cute Specification 2.1, "Hybrid Memory Cube with HMC-30G-VSR PHY 4GB 4H DRAM stack, 8 GB 8H DRAM stack", Published Oct. 2015, pp. 1-132.

(Continued)

*Primary Examiner* — Viet Q Nguyen
(74) *Attorney, Agent, or Firm* — PEARL COHEN ZEDEK LATZER BARATZ LLP

(57) ABSTRACT

A memory system comprises a monolithic integration of a NAND die, a MRAM die and one or more control dies positioned in a same semiconductor package for high speed and high density non-volatile data storage. The MRAM die can be operated as a cache for the NAND die or to provide long term data storage for data not cached for the NAND die. In one embodiment, the NAND die comprises a plurality of NAND strings. The MRAM die comprises a MRAM structure. The one or more control dies comprise one or more control circuits for operating the NAND die and the MRAM die.

15 Claims, 13 Drawing Sheets

(51) Int. Cl.

| | | |
|---|---|---|
| *H01L 23/00* | (2006.01) | |
| *H01L 25/065* | (2023.01) | |
| *H01L 25/18* | (2023.01) | |
| *H10B 80/00* | (2023.01) | |

(52) U.S. Cl.

CPC ...... *H01L 25/0652* (2013.01); *H01L 25/0657* (2013.01); *H01L 25/18* (2013.01); *H01L 2224/08145* (2013.01); *H01L 2225/06541* (2013.01); *H01L 2225/06586* (2013.01); *H01L 2924/1431* (2013.01); *H01L 2924/1443* (2013.01); *H01L 2924/14511* (2013.01)

(58) Field of Classification Search

CPC .......... H01L 25/18; H01L 2224/08145; H01L 2225/06541; H01L 2225/06586; H01L 2924/1431; H01L 2924/1443; H01L 2924/14511

USPC ..................................................... 365/185.05

See application file for complete search history.

(56) References Cited

U.S. PATENT DOCUMENTS

| | | | |
|---|---|---|---|
| 10,381,327 | B2 | 8/2019 | Ramachandra et al. |
| 2005/0133916 | A1* | 6/2005 | Karnezos ................. H01L 25/03 |
| | | | 257/E25.023 |
| 2014/0140138 | A1* | 5/2014 | Tran ..................... G11C 29/021 |
| | | | 365/185.18 |
| 2015/0253998 | A1* | 9/2015 | Park .................... G06F 12/0866 |
| | | | 711/103 |
| 2021/0050300 | A1* | 2/2021 | Lin ................ H03K 19/018592 |
| 2021/0089394 | A1* | 3/2021 | Yu ......................... G11C 29/028 |
| 2021/0090983 | A1* | 3/2021 | Lin ......................... H01L 25/50 |
| 2021/0210500 | A1* | 7/2021 | Lin ..................... H01L 23/5386 |
| 2021/0242171 | A1* | 8/2021 | Lee .......................... G11C 5/04 |
| 2021/0286555 | A1* | 9/2021 | Li .......................... G06F 3/0649 |
| 2023/0240076 | A1* | 7/2023 | Kim ........................ H01L 25/50 |
| | | | 257/314 |
| 2023/0253364 | A1* | 8/2023 | Cheng ................. H01L 25/0652 |
| | | | 257/777 |
| 2024/0071493 | A1* | 2/2024 | Zainuddin ............. G06F 3/0653 |
| 2024/0321839 | A1* | 9/2024 | Mun ................... H01L 23/5385 |

OTHER PUBLICATIONS

Ivan Kuten, Promwad, "Hybrid Memory Cubes: What They Are and How They Work", Jan. 22, 2019, pp. 1-9.

Trader, Tiffany, "Micron Readies Hybrid Memory Cube for Debut", Jan. 17, 2013, pp. 1-10.

\* cited by examiner

Host N

Host 3

Host 2

Host 1

1320

Fabric Manager and Memory Controllers

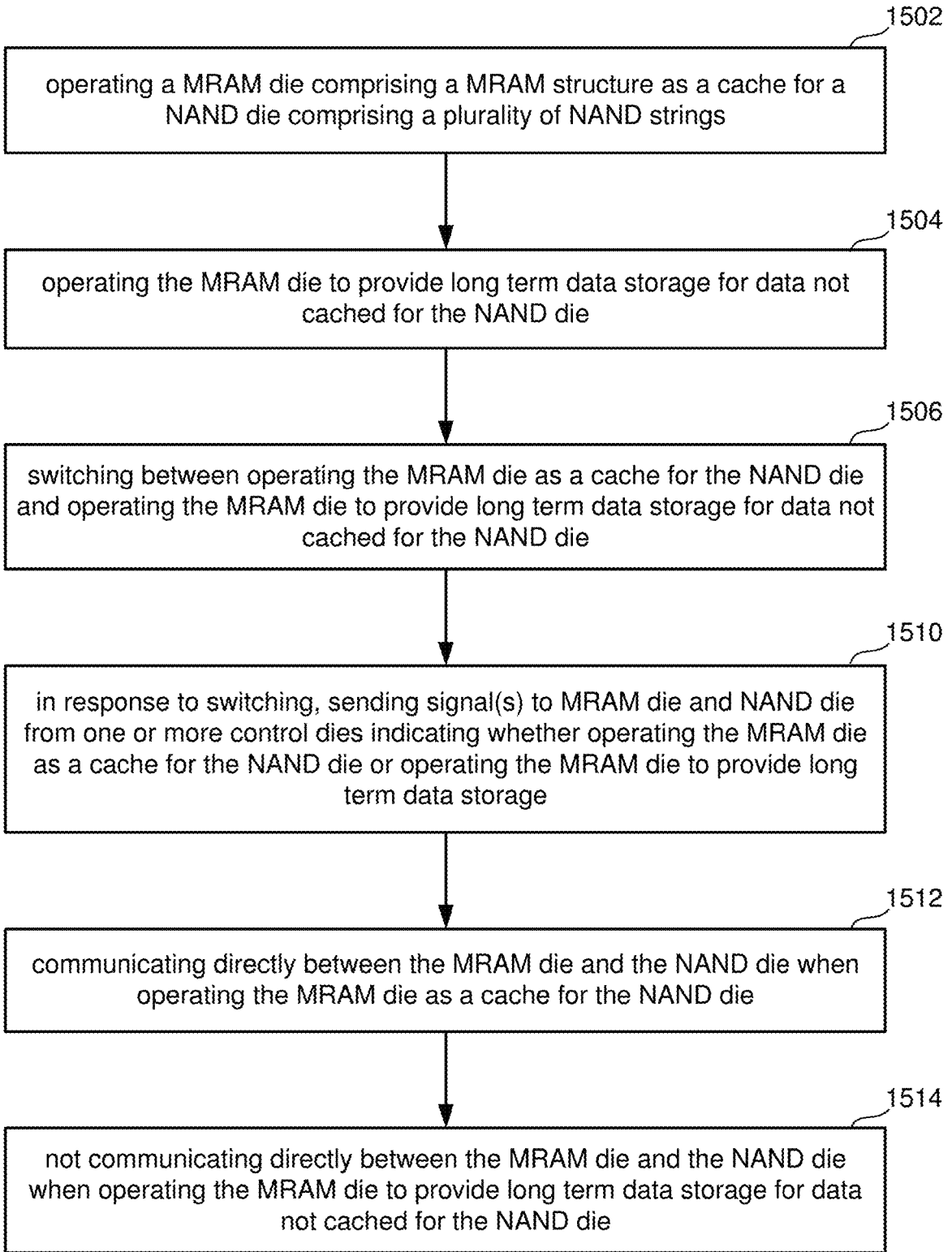

1502 operating a MRAM die comprising a MRAM structure as a cache for a NAND die comprising a plurality of NAND strings

1504 operating the MRAM die to provide long term data storage for data not cached for the NAND die

1506 switching between operating the MRAM die as a cache for the NAND die and operating the MRAM die to provide long term data storage for data not cached for the NAND die

1510 in response to switching, sending signal(s) to MRAM die and NAND die from one or more control dies indicating whether operating the MRAM die as a cache for the NAND die or operating the MRAM die to provide long term data storage

1512 communicating directly between the MRAM die and the NAND die when operating the MRAM die as a cache for the NAND die

1514 not communicating directly between the MRAM die and the NAND die when operating the MRAM die to provide long term data storage for data not cached for the NAND die

INTEGRATED MEMORY AND CONTROL DIES

CLAIM TO PRIORITY

The present application claims priority from U.S. Provisional Patent Application No. 63/484,588, entitled "INTEGRATED MEMORY AND CONTROL DIES", filed Feb. 13, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

High performance, less power consumption, low-read latency, high-speed data caching and high-speed programing are key challenges to meet customer demands regarding non-volatile storage devices, especially when users are recording high-resolution images on-the-fly using wearables (e.g. body cams), electric cars, aircrafts, spacecraft, etc. Additionally, the exponential growth of the use and volume of data (e.g., for machine learning purposes) require high speed and high density memories (as well as high speed interfaces) to power such use cases as data centers, medical services, automobiles, spacecraft, scientific research, etc.

In order to increase memory density, 3D NAND is scaling rapidly to meet customer demands. However, scaling of data cache and operating speeds (i.e. low read latency and low write latency) have been limited.

BRIEF DESCRIPTION OF THE DRAWINGS

Like-numbered elements refer to common components in the different figures.

FIG. 1 is a block diagram depicting one embodiment of a storage system.

FIG. 5 is a block diagram of a NAND die, a MRAM die, and multiple control dies that are positioned in a same semiconductor package and are in communication with a memory controller die external to the semiconductor package.

FIG. 12 is a block diagram of multiple NAND dies, multiple MRAM dies, a control die and a memory controller die that are positioned in a same semiconductor package and are in communication with a host that is external to the semiconductor package.

FIG. 13 is a block diagram of integrated NAND dies, MRAM dies, and control dies in communication with a Fabric Manager and a plurality of memory controllers for supporting a plurality of hosts.

FIG. 15 is a flow chart describing one embodiment of a process for operating the memory systems described herein.

DETAILED DESCRIPTION

Figure 2A:
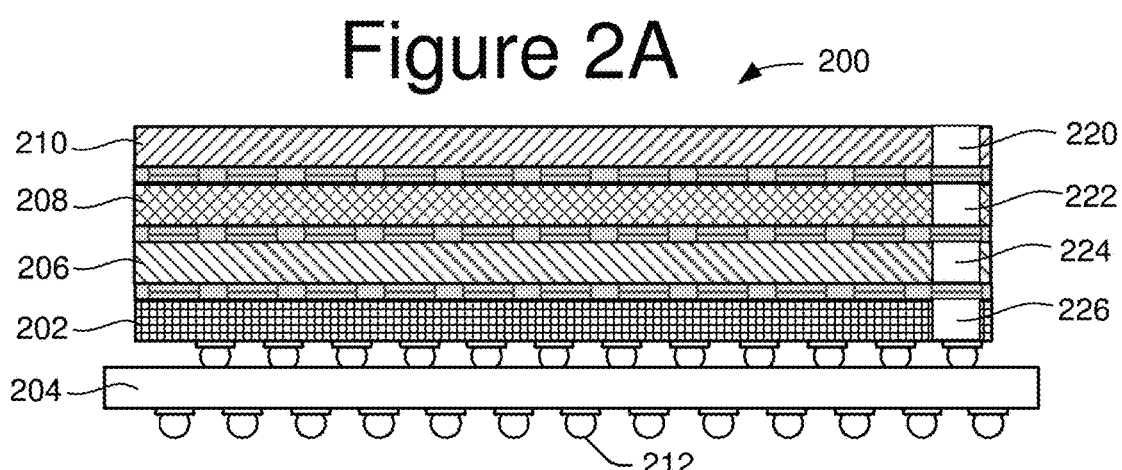
FIG. 2A is a block diagram of a NAND die, a MRAM die, a control die and a memory controller die positioned in a same semiconductor package.

In view of the above described challenges, new caching and data storage architectures are proposed. In one embodiment, a memory system comprises a monolithic integration of one or more NAND dies, one or more magnetoresistive random-access memory (MRAM) dies and one or more control dies positioned in a same semiconductor package for high speed and high density non-volatile data storage. The MRAM dies can be operated as a cache for the NAND dies or to provide long term data storage for data not cached for the NAND dies. The NAND dies each comprise a plurality of NAND strings. The MRAM dies each comprise a MRAM structure. The one or more control dies comprise one or more control circuits for operating the NAND dies and the MRAM dies.

Figure 1:
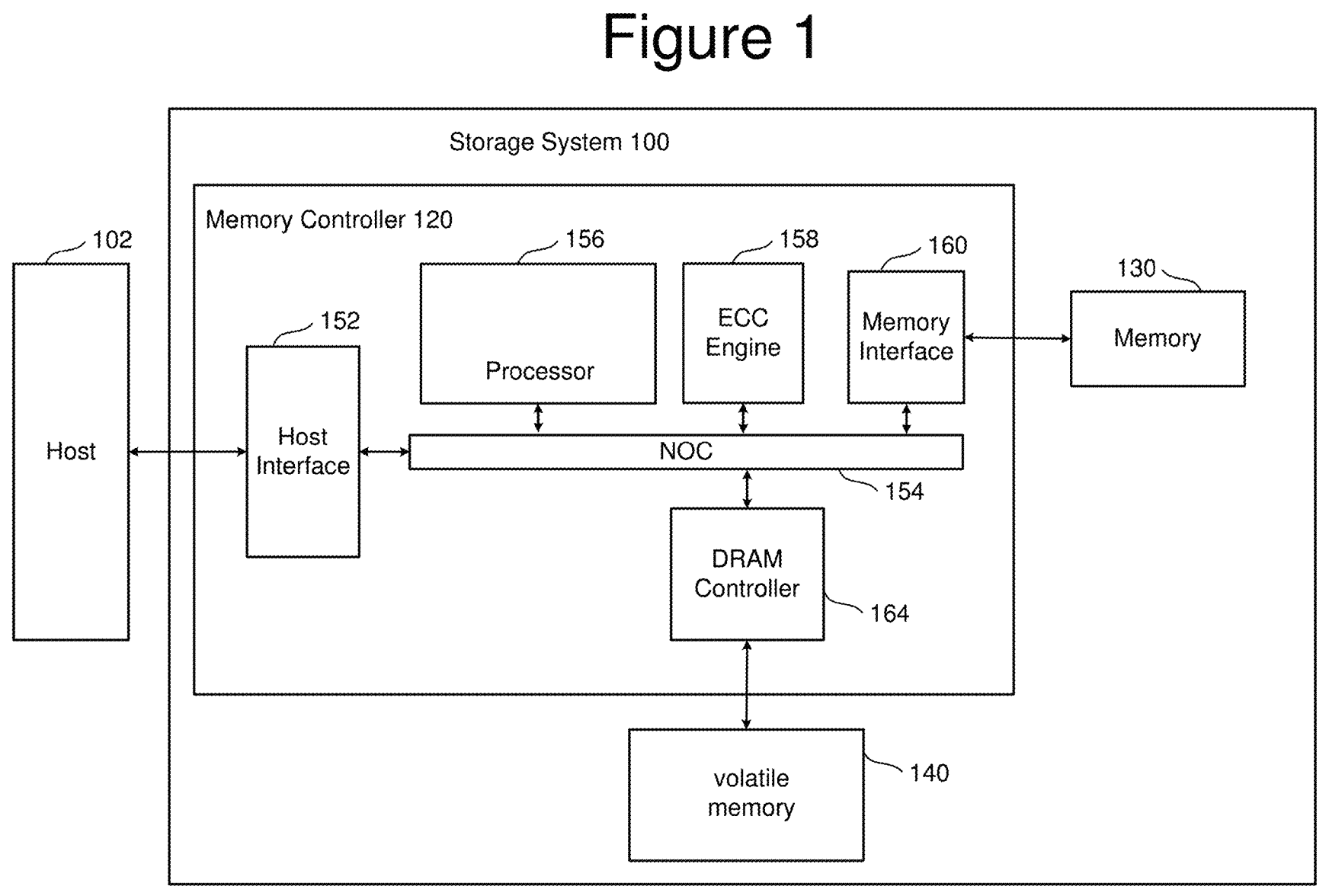

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system.

The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface 160 provides a Toggle Mode interface. Other interfaces can also be used. In some example implementations, memory interface 160 (or another portion of controller 120) implements a scheduler and buffer for transmitting data to and receiving data from one or more memory die.

In one embodiment, non-volatile memory 130 comprises one or more memory dies. The one or more memory dies can implement any of the different types of non-volatile memory structures. In one embodiment, the implemented memory structure comprises a three-dimensional memory array of non-volatile memory cells in which multiple memory levels are formed above a single substrate, such as a wafer. The memory structure in a memory die may comprise any type of non-volatile memory that is monolithically formed in one or more physical levels of memory cells having an active area disposed above a silicon (or other type of) substrate. In one example, the non-volatile memory cells comprise vertical NAND strings with charge-trapping layers. In another embodiment, the memory structure comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in a memory structure is not limited to the examples above. Many different types of memory array architectures or memory technologies can be used. No particular non-volatile memory technology is required for purposes of the new claimed embodiments proposed herein. Other examples of suitable technologies for memory cells of the memory structure include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

One example of MRAM stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

FIG. 2A is a block diagram of one embodiment of memory controller 120 and non-volatile memory 130 as an integrated assembly comprising a semiconductor package 200 that includes a NAND die 210 having a plurality of NAND strings; a magnetoresistive random-access memory (MRAM) die 208 having a MRAM structure; a control die 206 having one or more control circuits connected to the NAND die 210 and the MRAM die 208; a memory controller die 202 (implementing memory controller 120) and a substrate 204. At the bottom of substrate 204 are solder balls for connecting to and interfacing with other electrical components, such as host 102. As depicted in FIG. 2A, NAND die 210, MRAM die 208, control die 206, and memory controller die 202 are positioned in a same semiconductor package 200. Memory controller die 202 (which implements memory controller 120) is connected to and in direct communication with control die 206; however, the memory controller die 202 (including memory controller 120) is physically separate from control die 206. FIG. 2A shows NAND die 210, MRAM die 208, control die 206, and memory controller die 202 in a single vertical stack with NAND die 210 at the top of the stack, MRAM die 208 below NAND die 210, control die 206 below MRAM die 208, and memory controller die 202 below control die 206; however, other orders of stacking the dies can also be used.

Figure 2B:
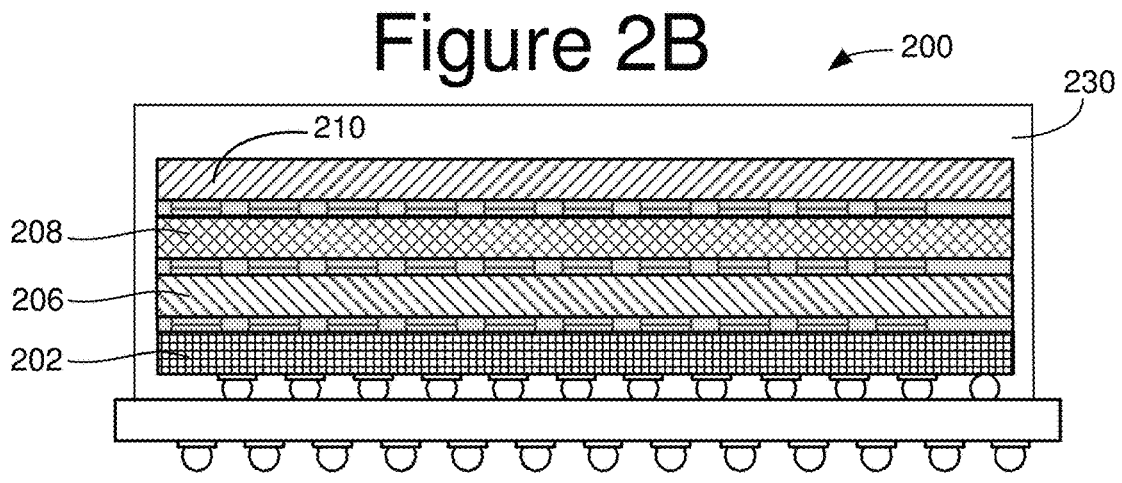
FIG. 2B is a block diagram of a NAND die, a MRAM die, a control die and a memory controller die positioned in a same semiconductor package.

In one embodiment, NAND die 210, MRAM die 208, control die 206, and memory controller die 202 are positioned in a single vertical stack encased within the same semiconductor package, such as being encapsulated in a protective housing forming the semiconductor package. For example, FIG. 2B depicts NAND die 210, MRAM die 208, control die 206, and memory controller die 202 encapsulated in a molding compound 230 forming (at least a portion of or all of) the semiconductor package. The molding compound may include, for example, solid epoxy resin, Phenol resin, fused silica, crystalline silica, carbon black and/or metal hydroxide. Such molding compounds are available from Sumitomo Corp. and Nitto-Denko Corp., both having headquarters in Japan. Other molding compounds from other manufacturers can also be used. The molding compound may be applied according to various known processes, including by transfer molding or injection molding techniques. The encapsulation process may be performed by FFT (Flow Free Thin) compression molding in further embodiments.

In one embodiment, NAND die 210 comprises a plurality of vertical NAND strings arranged in blocks. Each NAND string comprises multiple memory cells connected in series, as is well known in the art. One example of a suitable plurality of vertical NAND strings can be found in U.S. Pat. No. 11,551,765, incorporated by reference in its entirety.

In one embodiment, MRAM die 208 comprises a MRAM structure. The MRAM structure includes a plurality of MRAM cells. In one embodiment, the MRAM cells form a cross point array. One example of a suitable structure for the MRAM cells can be found in U.S. Pat. Nos. 11,004,489 and/or 10,211,393, both of which are incorporated by reference in their entirety.

Control die 206 is configured to control programming and reading for the MRAM structure on MRAM die 208 and for the NAND strings on NAND die 210. In one embodiment, memory controller die 202 implements memory controller 120 or a different structure for a memory controller.

In one embodiment, each of NAND die 210, MRAM die 208, control die 206, and memory controller die 202 have bond pads on the bottom and/or top surfaces of the dies. The bond pads are used to directly attach/bond (e.g., flip chip bonded) the dies together and transmit electrical signals (e.g., voltages and/or currents) between the dies. In one embodiment, the pattern of bond pads at the bottom surface of NAND die 210 matches the pattern of bond pads on the top surface of MRAM die 208, the pattern of bond pads at the bottom surface of MRAM die 208 matches the pattern of bond pads on the top surface of control die 206, and the pattern of bond pads at the bottom surface of control die 206 matches the pattern of bond pads on the top surface of memory controller die 202. The bottom surface of memory controller die 202 includes solder balls for attaching to and providing electrical signals to a circuit on substrate 204. The bond pads may be formed for example of copper, aluminum and alloys thereof. There may be a liner between the bond pads and the surfaces of the dies. The liner may be formed for example of a titanium/titanium nitride stack. The bond pads and liner may be applied by vapor deposition and/or plating techniques. Metal interconnects and/or vias may be used to electrically connect various elements in the dies to the bond pads.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. In one embodiment, the bond pad size is in the range of 50 nm to 5 μm, and spaced from each other with a pitch of 50 nm to 5 μm, although lesser or greater bond pad size and spacing between the bonding pads can be employed. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used to provide bond pads with even smaller sizes and pitches.

Some embodiments may include a film on the surface of the semiconductor dies 202, 204, 206 and 208. Where no such film is initially provided, a space between the dies may be under filled with an epoxy or other resin or polymer. The under-fill material may be applied as a liquid which then hardens into a solid layer. This under-fill step protects the electrical connections between the dies, and further secures the dies together. Various materials may be used as under-fill material, but in embodiments, it may be Hysol epoxy resin from Henkel Corp., having offices in California, USA.

Through silicon vias (TSV) may be used to route signals through the dies. For example, FIG. 2A shows TSV 220 routing signals through NAND die 210, TSV 222 routing signals through MRAM die 208, TSV 224 routing signals through control die 206, and TSV 226 routing signals through memory controller die 202. The dies can include more TSVs than depicted in FIG. 2A. The TSVs may be formed before, during or after formation of the integrated circuits in the semiconductor dies. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, tungsten, nickel, gold, doped polysilicon, and alloys or combinations thereof may be used. Note that FIGS. 2B, 4A, 4B, 5, 7-9 and 12-14 do not show the TSVs in order to simplify the drawings, but those embodiments can include TSVs.

Solder balls 212 may optionally be affixed to contact pads on a lower surface of substrate 204. The solder balls 212 may be used to electrically and mechanically couple the integrated memory assembly 200 to host 102 or another device on a printed circuit board. Solder balls 212 may be omitted where the integrated memory assembly 200 is to be used as a land grid array ("LGA") package. The solder balls 212 may form a part of the interface between the integrated memory assembly 200 and host 102.

Figure 2C:
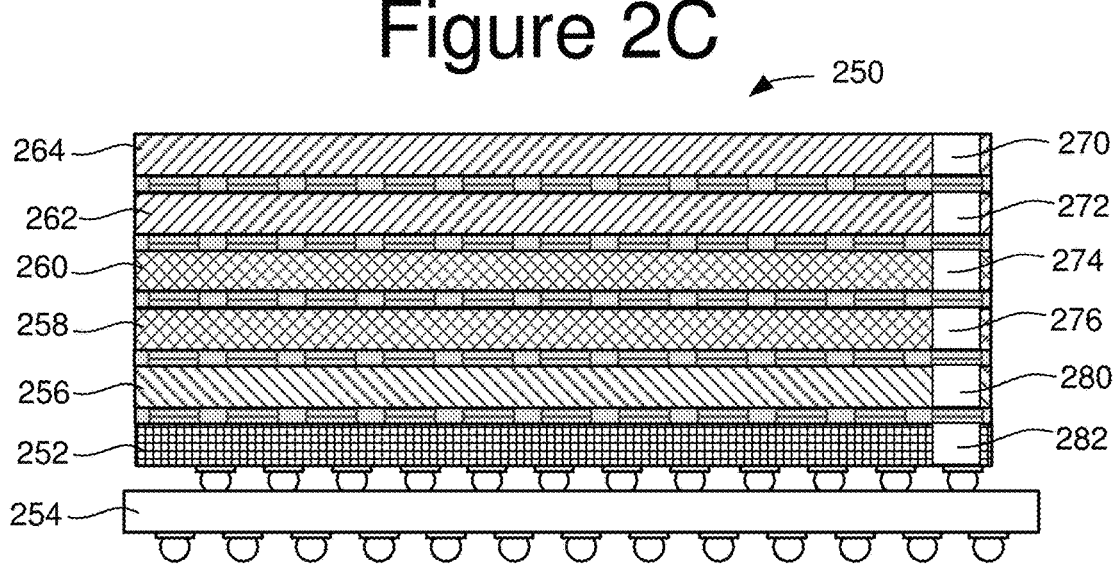
FIG. 2C is a block diagram of multiple NAND dies, multiple MRAM dies, a control die and a memory controller die positioned in a same semiconductor package.

FIG. 2C is a block diagram of one embodiment of non-volatile memory 130 as an integrated assembly comprising multiple (e.g., additional) NAND dies (262 and 264), multiple (e.g., additional) MRAM dies (258 and 260), a control die (256) and a memory controller die (252) arranged in a single vertical stack on top of substrate 254 and positioned in a same semiconductor package 250. FIG. 2C shows TSV 270 routing signals through NAND die 264, TSV 272 routing signals through NAND die 262, TSV 274 routing signals through MRAM die 260, TSV 276 routing signals through MRAM die 258, TSV 280 routing signals through control die 256, and TSV 282 routing signals through memory controller die 252. The dies can include more TSVs than depicted in FIG. 2C. Although FIG. 2C shows two NAND dies and two MRAM dies, more than two NAND dies and/or two MRAM dies can be used. In one embodiment, each of the multiple MRAM dies has a MRAM structure and is connected to control die 256, and each of the multiple NAND dies has NAND strings and is connected to control die 256.

Figure 3:
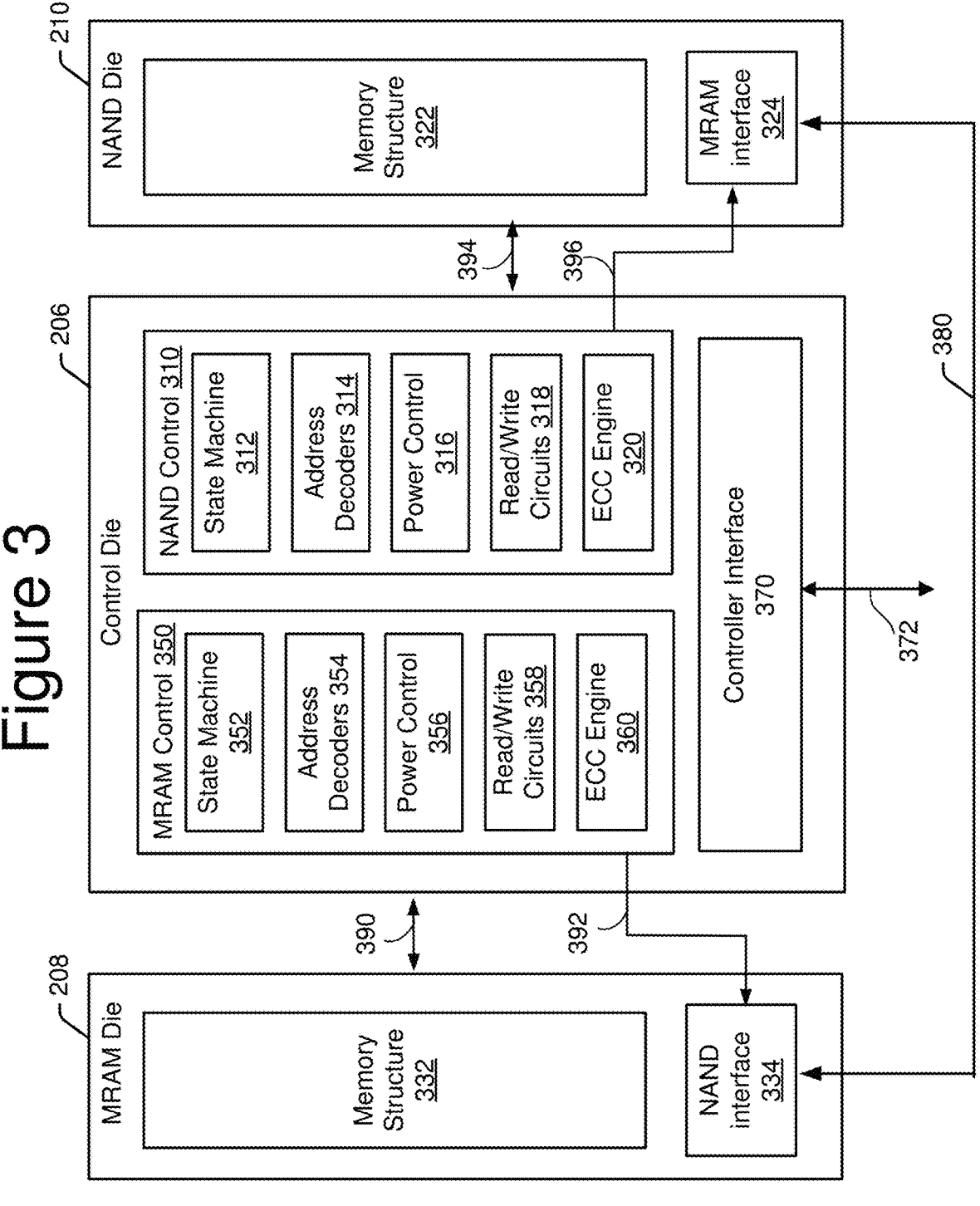
FIG. 3 is a block diagram of a NAND die, a MRAM die, and a control die that are positioned in a same semiconductor package.

FIG. 3 is a block diagram that shows components of and connections between a NAND die, a MRAM die, and a control die that are positioned in a same semiconductor package. The teachings of FIG. 3 apply to the structures of FIGS. 2A-C, as well as other structures described below.

FIG. 3 shows control die 206 connected to and in communication with MRAM die 208 (via signals 390 and 392) and connected to and in communication with NAND die 210 (via signals 394 and 396). NAND die 210 includes memory structure 322. Memory structure 322 contains non-volatile memory cells. In one embodiment, memory structure 322 is a flash memory array comprising NAND strings arranged in blocks. NAND die 210 also includes MRAM interface 324 for communicating directly with MRAM die 208 (via NAND interface 334 on MRAM die 208). In another embodiment, NAND die 210 is replaced by another type of memory die that implements a different type of non-volatile memory, such as a memory array of NOR flash memory cells, PCM, etc.

Control die 206 includes NAND control circuitry 310 for controlling/operating NAND die 210. NAND control circuitry 310 comprises a set of electrical circuits that perform memory operations (e.g., write, read, erase and others) on memory structure 322. NAND control circuitry 310 includes state machine 312, on-chip address decoders 314, a power control circuit 316, read/write circuits 318, and ECC engine 320. In another embodiment, a portion of the read/write circuits 318 are located on control die 206 and a portion of the read/write circuits 318 are located on NAND die 210. For example, the read/write circuits 318 may contain sense amplifiers. In one embodiment, the sense amplifiers are located on the control die 206. In one embodiment, the sense amplifiers are located on the NAND die 210.

State machine 312 is an electrical circuit that controls the operations performed by control die 206. In some embodiments, state machine 312 is implemented by or replaced by a microprocessor, microcontroller and/or RISC processor. Address decoders 314 provide an address interface between addresses used by host 102 or memory controller 120 to the hardware address used by row decoders and column decoders (not expressly depicted in FIG. 3). Power control circuit 316 controls the power and voltages supplied to the word lines, bit lines, and select lines during memory operations. Power control circuit 316 may include charge pumps or other voltage sources for creating voltages. The power control circuit 316 executes under control of the state machine 312. Read/write circuits 318 include sense blocks (which may contain sense amplifiers). The sense amplifiers include bit line drivers. The read/write circuits 318 execute under control of the state machine 312.

In one embodiment, ECC engine 320 is a circuit configured to encode data bits from memory controller 120 into codewords that contain the data bits and parity bits. The control circuitry stores the codewords in the memory structure 322. In one embodiment, the ECC engine 320 is also configured to decode the codewords which are read from the memory structure 322. In some embodiments, if ECC engine 320 is successful at decoding a codeword, then control die 206 only sends back the data bits to the memory controller 120. In some embodiments, if ECC engine 320 is not successful at decoding a codeword, then the memory controller ECC engine 158 may be used to decode the codeword.

MRAM die 208 includes include memory structure 332. Memory structure 332 contains MRAM memory cells. In one embodiment, memory structure 332 is a cross point array. MRAM die 208 also includes NAND interface 334 for communicating directly with NAND die 210 (via MRAM interface 324). Control die 206 includes MRAM control circuitry 350 for controlling/operating MRAM die 208. MRAM control circuitry 350 comprises a set of electrical circuits that perform memory operations (e.g., write, read, erase and others) on memory structure 332. MRAM control circuitry 350 includes state machine 352, on-chip address decoders 354, a power control circuit 356, read/write circuits 358, and ECC engine 360, all of which function similar to the counterparts of NAND control circuitry 310 described above (but for the MRAM rather than the NAND). In another embodiment, a portion of the read/write circuits 358 are located on control die 206 and a portion of the read/write circuits 358 are located on MRAM die 208. For example, the read/write circuits 358 may contain sense amplifiers. In one embodiment, the sense amplifiers are located on the control die 206. In one embodiment, the sense amplifiers are located on the MRAM die 208.

Controller interface 370, which is connected to MRAM control circuitry 350 and NAND control circuitry 310, is an electrical interface for communicating with memory controller 120 on memory controller die 202. For example, memory controller interface 370 may implement a Toggle Mode Interface (e.g., SDR or DDR) that connects to the Toggle Mode interface of memory controller 120. In one embodiment, memory controller interface 370 includes a set of input and/or output (I/O) pins that connect to communication channel 372 (which includes a data bus). In one embodiment, communication channel 372 connects to the memory controller 120 of die 202 as part of the Toggle Mode Interface. In one embodiment, the memory controller (see memory controller die 202 of FIG. 2A and memory controller 120 of FIG. 1) communicates with host 102 via a Compute Express Link ("CXL") interface that includes parallel data transfer of 8, 16, 64, or 128 bits between the memory controller and the host 102.

For purposes of this document, the phrases "a control circuit" or "one or more control circuits" can include any one of or any combination of memory controller 120, state machine 312, state machine 352, all or a portion of NAND control circuitry 310, all or a portion of MRAM control circuitry 350, a microcontroller, a microprocessor, and/or other similar functioned circuits. The control circuit can include hardware only or a combination of hardware and software (including firmware). For example, a memory controller or state machine programmed by firmware to perform the functions described herein is one example of a control circuit. A control circuit can include a processor, FPGA, ASIC, integrated circuit, or other type of circuit.

NAND control circuitry 310 provides signals 396 to MRAM interface 324 of NAND die 210 to control MRAM interface 324. MRAM control circuitry 350 provides signals 392 to NAND interface 334 of MRAM die 208 to control NAND interface 334. MRAM interface 324 is connected to and directly communicates with NAND interface 334 via signals 380 (a direct electrical connection between the MRAM die 208 and the NAND die 210) in order to transfer data between MRAM die 208 and NAND die 210. In one embodiment, signals 380 include a data bus (serial or parallel bits), a clock signal and one or more command signals. In one embodiment, signals 380 implement a Toggle Mode Interface (e.g., SDR or DDR).

In one embodiment, MRAM die 208 can operate in two modes. In a first mode, MRAM die 208 is configured to operate as a cache for NAND die 210. In a second mode, MRAM die 208 is configured to provide long term data storage for data not cached for the NAND die 210 (and not stored in the NAND die 210). That is, the memory system can store host data (e.g., data received from the host) in Memory Structure 332 of MRAM die 208 for purposes of long-term storage (as opposed to storing to cache the data for the NAND die 210). A signal from control die 206 to NAND die 210 (part of signals 394) and a signal from control die 206 to the MRAM die 208 (part of signals 390) indicates whether the MRAM die 208 is operating as a cache for the NAND die 210 or providing long term data storage. MRAM die 208 and NAND die 210 are configured to directly communicate with each other via the electrical connection of signals 380 when MRAM die 208 is configured to operate as a cache for the NAND die 210. MRAM die 208 and NAND die 210 are configured to not directly communicate with each other via the electrical connection of signals 380 (or any other communication path) when the MRAM die 208 is providing long-term data storage.

Figures 4A, 4B:
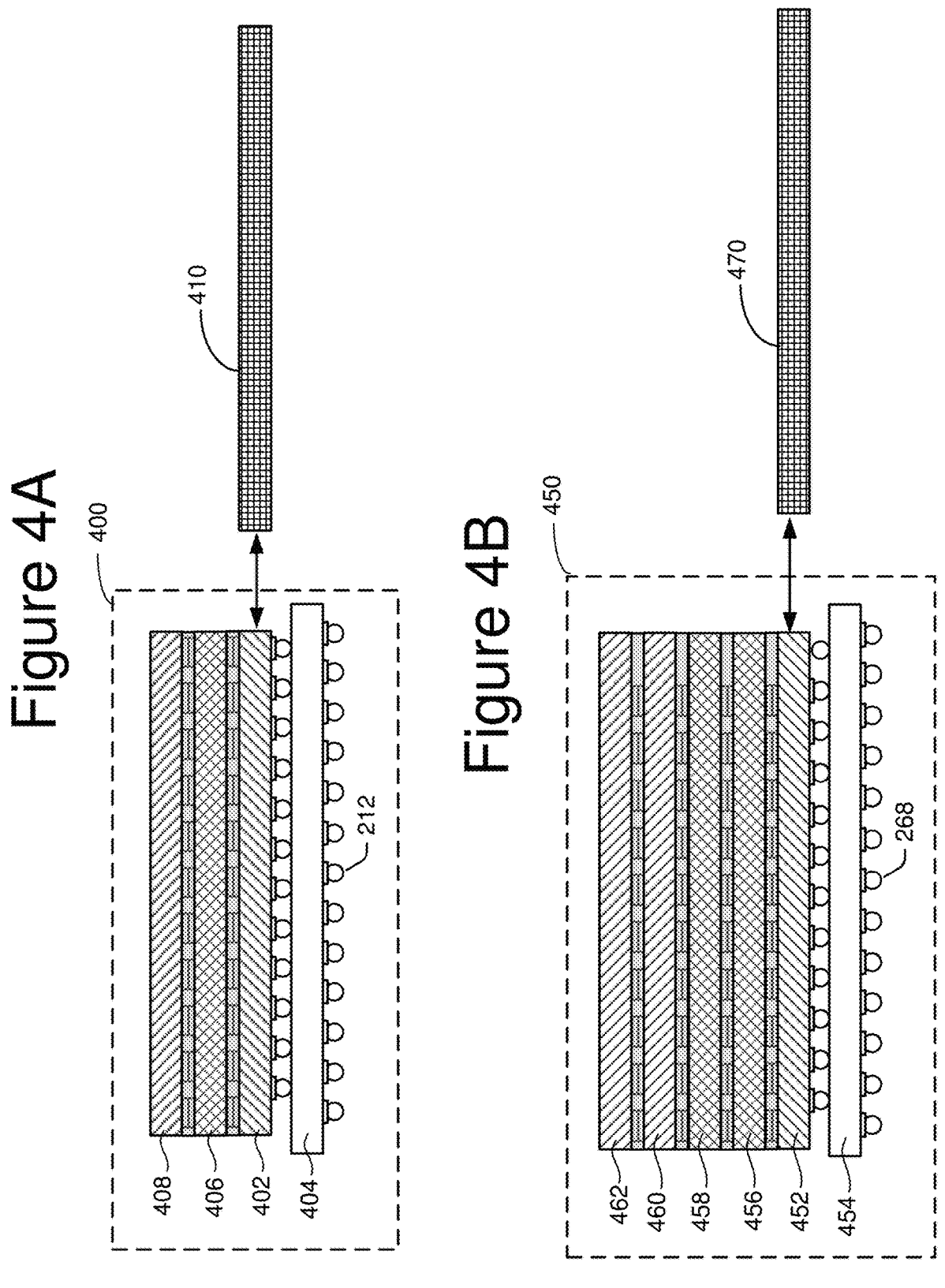
FIG. 4A is a block diagram of a NAND die, a MRAM die, and a control die that are positioned in a same semiconductor package and are in communication with a memory controller die external to the semiconductor package.
FIG. 4B is a block diagram of multiple NAND dies, multiple MRAM dies, and a control die that are positioned in a same semiconductor package and are in communication with a memory controller die external to the semiconductor package.

FIG. 4A is a block diagram of a NAND die, a MRAM die, and a control die that are positioned in a same semiconductor package, in a single vertical stack, and are in communication with a memory controller die external to the semiconductor package. For example, FIG. 4A shows one embodiment of non-volatile memory 130 as an integrated assembly comprising a semiconductor package that includes a NAND die 408 (similar to NAND die 210) comprising a plurality of NAND strings; MRAM die 406 (similar to MRAM die 208) comprising a MRAM structure; control die 402 (similar to control die 206) comprising one or more control circuits connected to the NAND die 408 and the MRAM die 406; and a substrate 404. At the bottom of the substrate 404 are solder balls 212 for connecting to and interfacing with other electrical components, such as a memory controller 120 implemented on memory controller die 410. As depicted in FIG. 4A, NAND die 408, MRAM die 406, and control die 402 are positioned in a same semiconductor package 400. Memory controller die 410 (which implements memory controller 120) is connected to and in direct communication with control die 402; however, the memory controller die 410 (including memory controller 120) is physically separate from control die 402 and memory controller die 410 is outside of the semiconductor package 400. FIG. 4A shows NAND die 408, MRAM die 406, and control die 402 (all three of which are semiconductor dies) in a single vertical stack with NAND die 408 at the top of the stack, MRAM die 406 below NAND die 408, and control die 402 below MRAM die 406; however, other orders of stacking the dies can also be used. In one embodiment, NAND die 408, MRAM die 406, and control die 402 are positioned in a single vertical stack encased within the same semiconductor package, such as being encapsulated in a protective housing forming the semiconductor package (e.g., encapsulated in a molding compound). Control die 402 is configured to control programming and reading for the MRAM structure on MRAM die 406 and for the NAND strings on NAND die 408.

In one embodiment, each of NAND die 408, MRAM die 406, and control die 402 have bond pads on the bottom and/or top surfaces of the dies. The bond pads are used to directly attach/bond (e.g., flip chip bonded) the dies together and transmit electrical signals (e.g., voltages and/or currents) between the dies. In one embodiment, the pattern of bond pads at the bottom surface of NAND die 408 matches the pattern of bond pads on the top surface of MRAM die 406, and the pattern of bond pads at the bottom surface of MRAM die 406 matches the pattern of bond pads on the top surface of control die 402. The bottom surface of control die 402 includes solder balls for attaching to and providing electrical signals to a circuit on substrate 404. Through silicon vias (not depicted in FIGS. 4A and 4B to simplify the drawings) may be used to route signals through the dies.

FIG. 4B is a block diagram of one embodiment of non-volatile memory 130 as an integrated assembly comprising a semiconductor package 450 that includes multiple NAND dies (462 and 460), multiple MRAM dies (456 and 458), and a control die (452) arranged in a single vertical stack on top of substrate 454 and positioned in a same semiconductor package 450. Control die 452 is connected to and in communication with memory controller die 470, which is external to package 450. Although two NAND dies and two MRAM dies are depicted, more than two NAND dies and two MRAM dies can be included in the stack within same semiconductor package 450.

Figure 5:
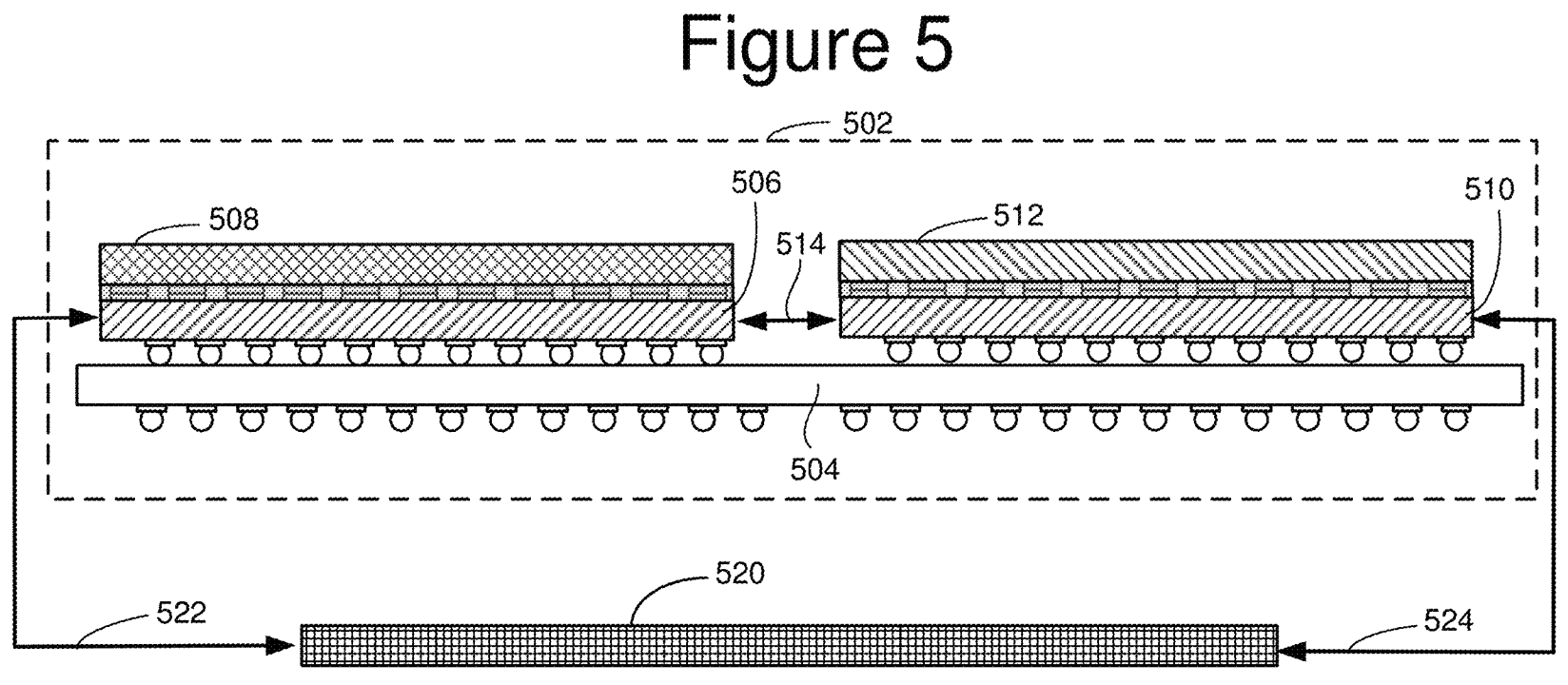

FIG. 5 is a block diagram of a NAND die, a MRAM die, and multiple control dies that are positioned in a same semiconductor package and are in communication with a memory controller die external to the semiconductor package. For example, FIG. 5 shows a first vertical stack comprising NAND die 512 (similar to NAND die 210) on top of NAND control die 510 and a second vertical stack comprising MRAM die 508 (similar to MRAM die 208) on top of MRAM control die 506. NAND control die 510 and MRAM control die 506 are mounted on substrate 504. NAND die 512, NAND control die 510, MRAM die 508 and MRAM control die 506 are all positioned in a same semiconductor package 502. NAND control die 510 and MRAM control die 506 are connected to and both include an interface to communicate with memory controller die 520 (implementing memory controller 120) via signals 524 and 522, respectively. Memory controller die 520 is external to semiconductor package 502. NAND control die 510 is directly connected to NAND die 512. MRAM control die 506 is directly connected to MRAM die 508. NAND control die 510 is configured to control programming and reading for the NAND strings on NAND die 512. MRAM control die 506 is configured to control programming and reading for the MRAM structure on MRAM die 508. NAND die 512, NAND control die 510, MRAM die 508 and MRAM control die 506 include bond pads to connect the die, as discussed above.

Figure 6:
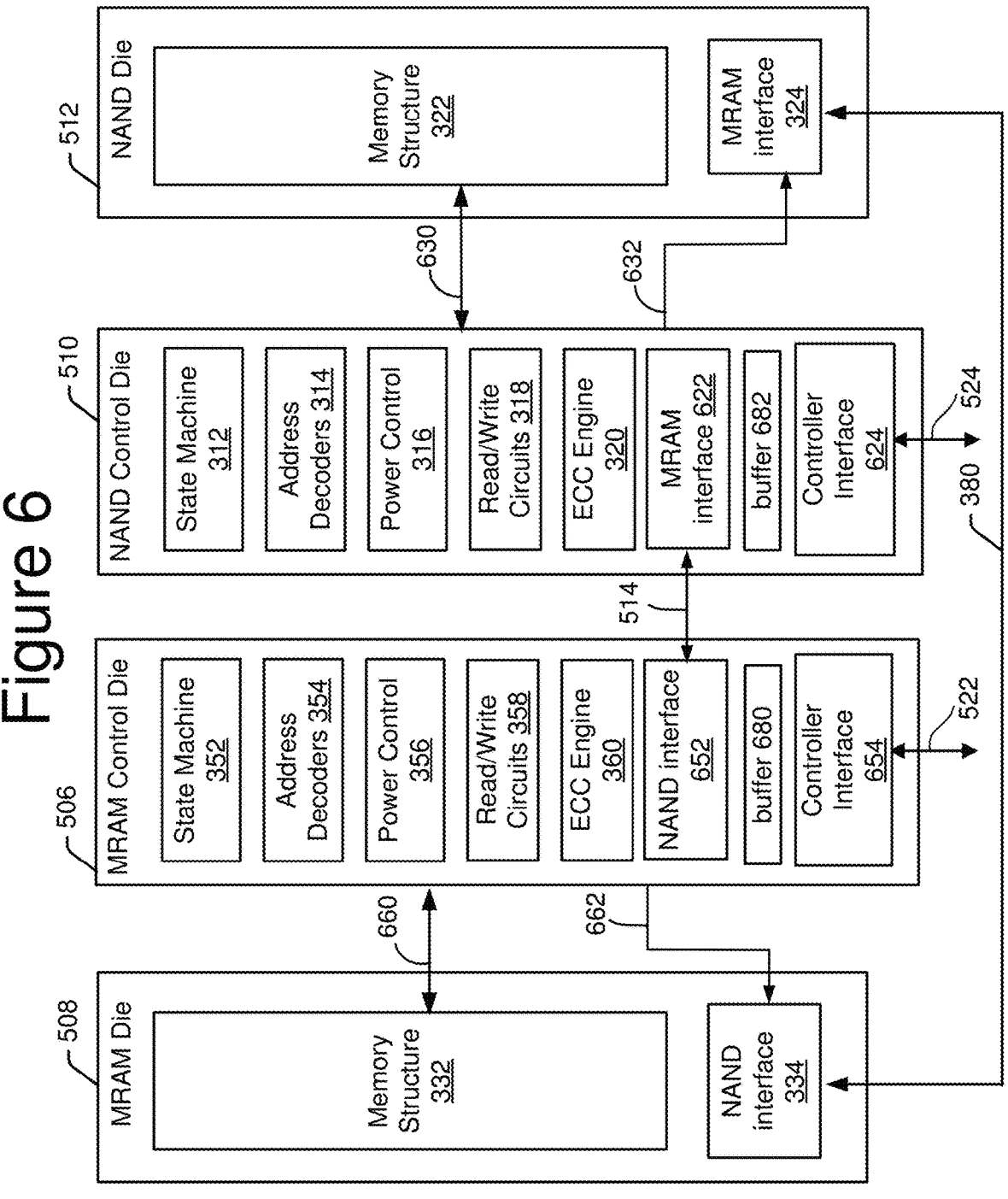
FIG. 6 is a block diagram of a NAND die, a MRAM die, and multiple control dies that are positioned in a same semiconductor package.

FIG. 6 is a block diagram of a NAND die, a MRAM die, and multiple control dies that are positioned in a same semiconductor package. That is, FIG. 6 provides additional details of the structure depicted in FIG. 5.

NAND die 512 includes memory structure 322 and MRAM interface 324. NAND control die 510 includes state machine 312, on-chip address decoders 314, a power control circuit 316, read/write circuits 318, and ECC engine 320, all of which are electrical circuits. NAND control die 510 also includes MRAM interface 622 for controlling MRAM interface 324 and a data buffer 682 for the NAND strings on NAND die 512.

MRAM die 508 includes memory structure 332 and NAND interface 334. MRAM control die 506 includes state machine 352, on-chip address decoders 354, a power control circuit 356, read/write circuits 358, and ECC engine 360, all of which are electrical circuits. MRAM control die 506 also includes NAND interface 652 for controlling NAND interface 334. MRAM control die 506 includes a data buffer 680 for the MRAM structure on MRAM die 508.

An electrical connection 380 exists between MRAM die 508 and the NAND die 512 such that MRAM die 508 and NAND die 512 are configured to directly communicate with each other via the electrical connection 380 when MRAM die 508 is configured to operate as a cache for the NAND die 512. MRAM die 508 and NAND die 512 are configured to not directly communicate with each other via the electrical connection 380 when MRAM die 508 is providing long term data storage for data not being stored on NAND die 512.

Figure 7:
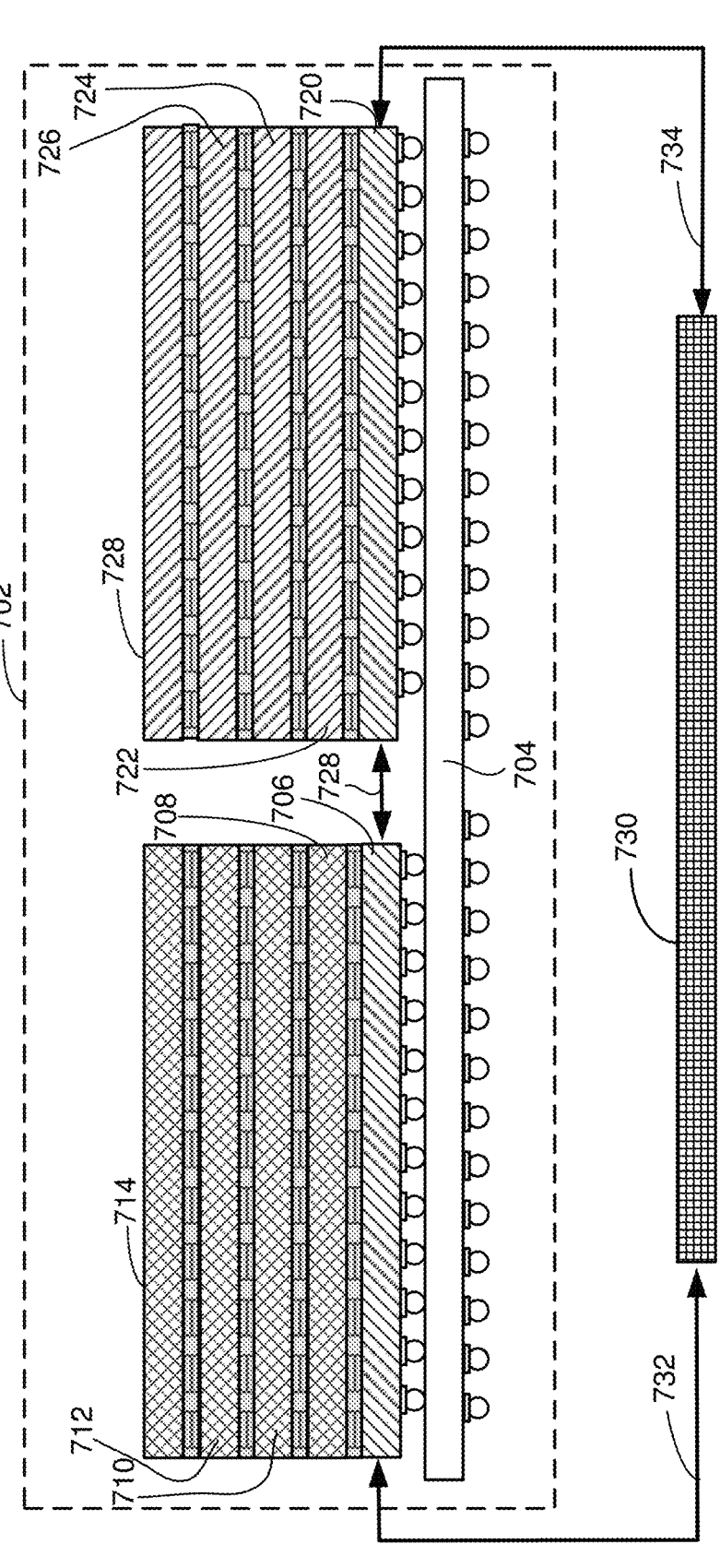
FIG. 7 is a block diagram of multiple NAND dies, multiple MRAM dies, and multiple control dies that are positioned in a same semiconductor package and are in communication with a memory controller die external to the semiconductor package.

FIG. 7 is a block diagram of multiple NAND dies, multiple MRAM dies, and multiple control dies that are positioned in a same semiconductor package. For example, FIG. 7 shows a first vertical stack comprising NAND dies 722, 724, 726 and 728 positioned above NAND control die 720 and a second vertical stack comprising MRAM dies 708, 710, 712 and 714 positioned above MRAM control die 706, all mounted on substrate 704 and all positioned in a same semiconductor package 702.

NAND control die 720 and MRAM control die 706 are connected to and both include an interface to communicate with memory controller die 730 (implementing memory controller 120) via signals 734 and 732, respectively. Memory controller die 730 is external to semiconductor package 702. NAND control die 720 is directly connected to the NAND dies 722-728. MRAM control die 706 is directly connected to MRAM dies 708-714. NAND control die 720 is configured to control programming and reading for the NAND strings on NAND dies 722-728. MRAM control die 706 is configured to control programming and reading for the MRAM structure on MRAM dies 708-714.

Figures 8, 9:
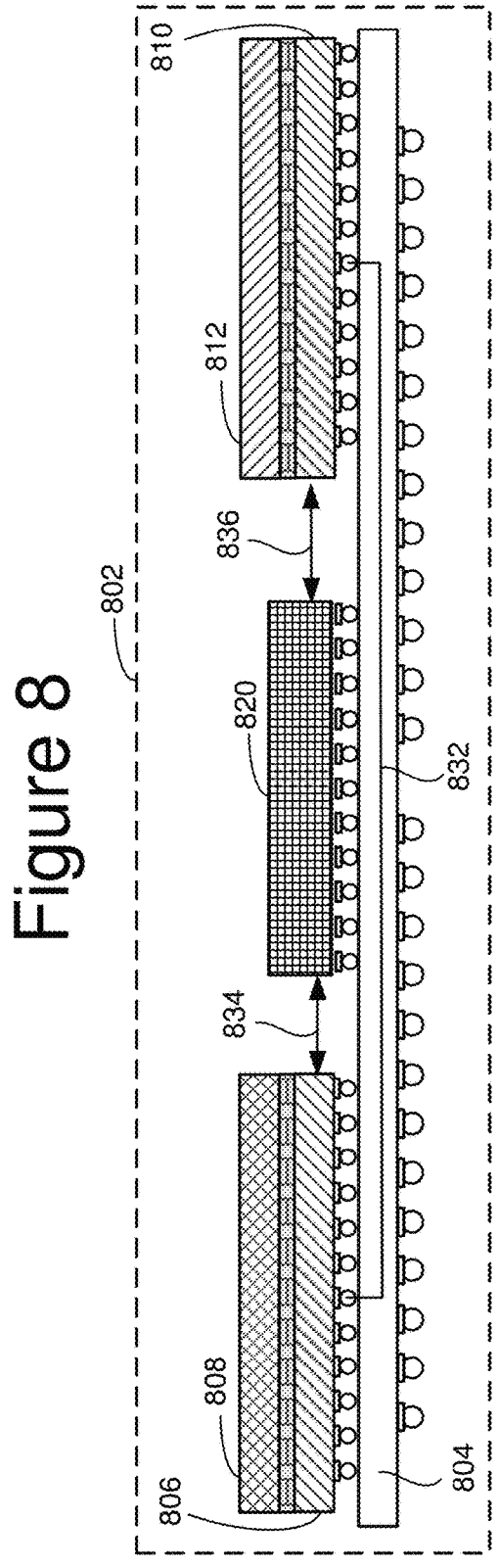
FIG. 8 is a block diagram of a NAND die, a MRAM die, multiple control dies and a memory controller die that are positioned in a same semiconductor package.
FIG. 9 is a block diagram of multiple NAND dies, multiple MRAM dies, multiple control dies and a memory controller die that are positioned in a same semiconductor package.

FIG. 8 is a block diagram of a NAND die, a MRAM die, multiple control dies and a memory controller die that are positioned in a same semiconductor package. For example, FIG. 8 shows a first vertical stack comprising NAND die 812 (similar to NAND die 512) on top of NAND control die 810 (similar to NAND control die 510) and a second vertical stack comprising MRAM die 808 (similar to MRAM die 508) on top of MRAM control die 806 (similar to MRAM control die 506). MRAM control die 806 and NAND control die 810 are mounted on substrate 804. NAND control die 810 and MRAM control die 806 are electrically connected to memory controller die 820 (implementing memory controller 120) via signals 836 and 834, respectively. NAND die 812, NAND control die 810, MRAM die 808, MRAM control die 806 and memory controller die 820 are all positioned in a same semiconductor package 802. NAND control die 810 is directly connected to NAND die 812. MRAM control die 806 is directly connected to MRAM die 808. NAND control die 810 is configured to control programming and reading for the NAND strings on NAND die 812. MRAM control die 806 is configured to control programming and reading for the MRAM structure on MRAM die 808. NAND die 812, NAND control die 810, MRAM die 808 and MRAM control die 806 include bond pads to connect the dies, as discussed above.

FIG. 9 is a block diagram of multiple NAND dies, multiple MRAM dies, multiple control dies and a memory controller die that are positioned in a same semiconductor package. For example, FIG. 9 shows a first vertical stack comprising NAND dies 922 and 924 (each similar to NAND die 512) positioned above NAND control die 920 (similar to NAND control die 510) and a second vertical stack comprising MRAM dies 908 and 910 (each similar to MRAM die 508) positioned above MRAM control die 906 (similar to MRAM control die 506). MRAM control die 906, NAND control die 920 and memory controller die 926 are mounted on substrate 904. NAND control die 920 and MRAM control die 906 are electrically connected to memory controller die 926 (implementing memory controller 120) via signals 932 and 930, respectively. NAND dies 922/924, NAND control die 920, MRAM dies 908/910, MRAM control die 906 and memory controller die 926 are all positioned in a same semiconductor package 902. NAND control die 920 is directly connected to NAND dies 922/924. MRAM control die 906 is directly connected to MRAM dies 908/910. NAND control die 920 is configured to control programming and reading for the NAND strings on NAND dies 922/924. MRAM control die 906 is configured to control programming and reading for the MRAM structures on MRAM dies 908/910. NAND control die 920 is directly connected to MRAM control die 906 via signals 934 (similar to signals 514). In some embodiments, NAND dies 922/924 can communicate with MRAM dies 908/910 as discussed above with respect to FIG. 6. NAND dies 922/924, NAND control die 920, MRAM dies 908/910 and MRAM control die 906 include bond pads to connect the dies, as discussed above. The block diagram of FIG. 6 applies to the structure of FIGS. 8 and 9.

Figure 10:
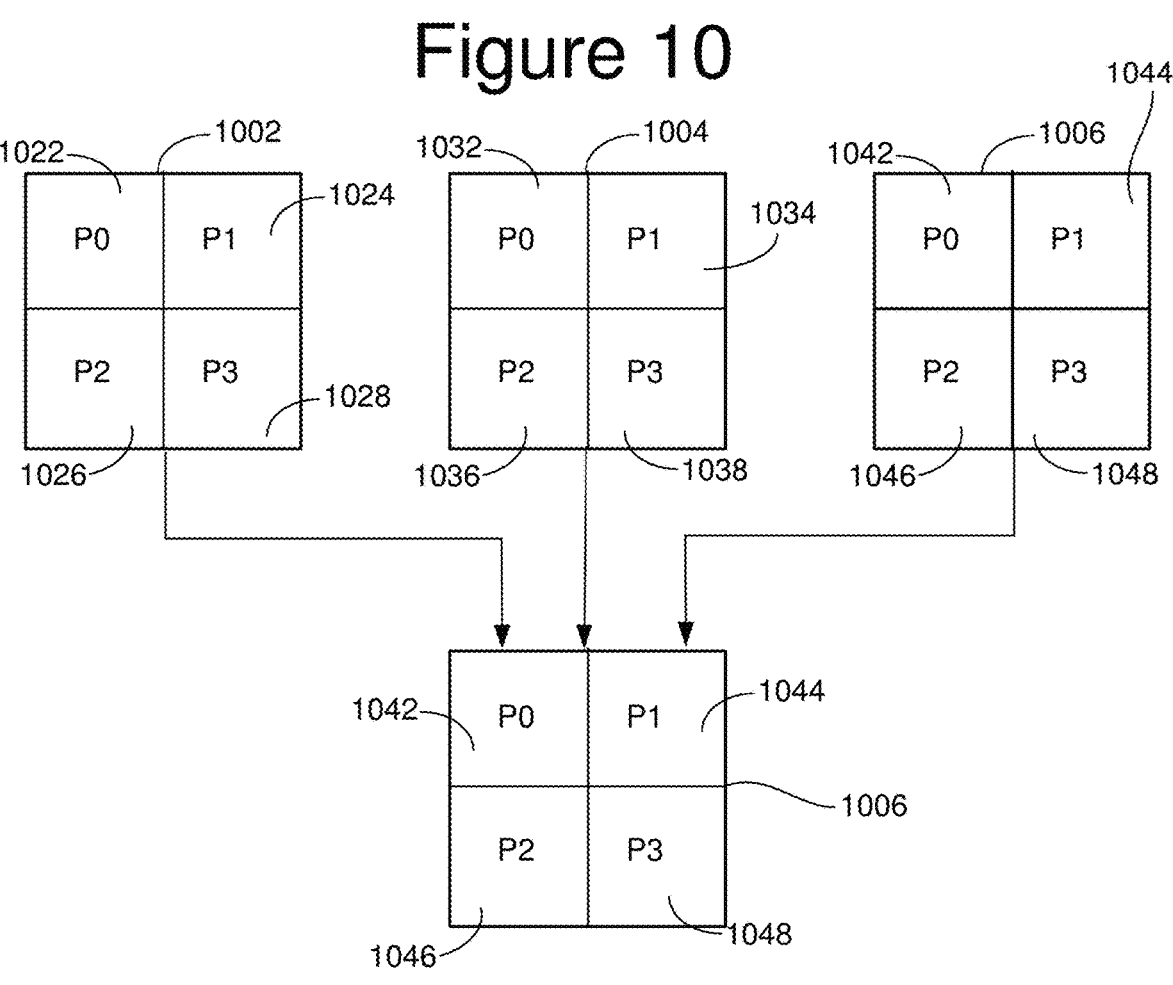
FIGS. 10 and 11 depicts multiple planes of a MRAM die, multiple planes of a NAND die, and circuits of the control die divided into multiple sections to provide support for the multiple planes that are vertically aligned.
Figure 11:
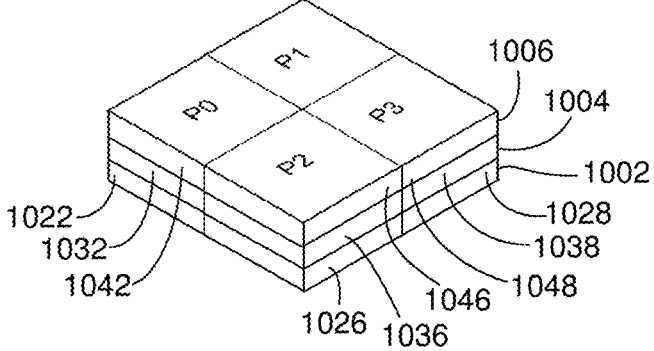

FIGS. 10 and 11 depict multiple planes of a MRAM die, multiple planes of a NAND die, and circuits of the control die divided into support for the multiple planes that are vertically aligned. As mentioned above, the MRAM die is configured to operate as a cache for the NAND die. In one embodiment, the NAND die includes multiple planes and the MRAM die includes multiple planes such that each plane of the MRAM die acts as a cache for a vertically aligned plane of the NAND die.

FIGS. 10 and 11 depict control die 1002 (similar to control die 206), MRAM die 1004 (similar to MRAM die 208) and NAND die 1006 (similar to NAND die 210). FIG. 10 depicts the three die separately and then a birds eye view of the three die stacked (with NAND die 1006 on top). FIG. 11 shows a perspective view of the control die 1002, MRAM die 1004 and NAND die 1006 in a single vertical stack (and in a same semiconductor package). NAND die 1006 is divided into four physical planes: P0 (1042), P1 (1044), P2 (1046) and P3 (1048). In one embodiment, each physical plane is a separate physical memory array with its own set of bit lines. In other embodiments, the physical planes may not have separate bit lines and/or may not be completely separate. In some embodiments, the physical planes may be programmed, erased and/or read concurrently. MRAM die 1004 is divided into four physical planes: P0 (1032), P1 (1034), P2 (1036) and P3 (1038). Each plane of MRAM die 1004 is capable of operating as a cache for a vertically aligned plane of NAND die 1006. Control die 1002 is also broken into sections P0 (1022), P1 (1024), P2 (1026) and P3 (1028). Each section of control die 1002 comprises circuits (e.g., circuits 312-320 and 352-360) to manage/control vertically aligned planes of the MRAM die 1004 and NAND die 1006. For example, plane P0 (1032) of MRAM die 1004 operates as a cache for plane P0 (1042) of NAND die 1006 such that plane P0 (1032) of MRAM die 1004 and plane P0 (1042) of NAND die 1006 are operated by the circuits of section P0 (1022) of control die 1002; plane P1 (1034) of MRAM die 1004 operates as a cache for plane P1 (1044) of NAND die 1006 such that plane P1 (1034) of MRAM die 1004 and plane P1 (1044) of NAND die 1006 are operated by the circuits of section P1 (1024) of control die 1002; plane P2 (1036) of MRAM die 1004 operates as a cache for plane P2 (1046) of NAND die 1006 such that plane P2 (1036) of MRAM die 1004 and plane P2 (1046) of NAND die 1006 are operated by the circuits of section P2 (1026) of control die 1002; and plane P3 (1038) of MRAM die 1004 operates as a cache for plane P3 (1048) of NAND die 1006 such that plane P3 (1038) of MRAM die 1004 and plane P3 (1048) of NAND die 1006 are operated by the circuits of section P3 (1028) of control die 1002. Although four plane configurations are described above, lesser, or greater than four planes can be employed. For instance, one-plane, two-plane, six-plane, eight-plane, 16-plane configurations can be employed.

Figure 12:
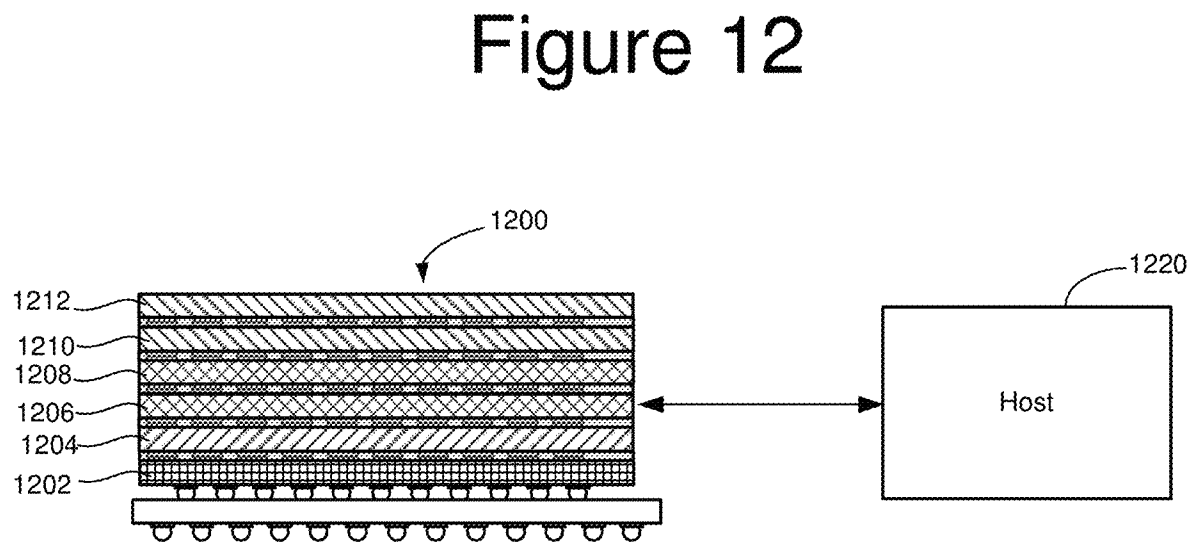
Figure 13:
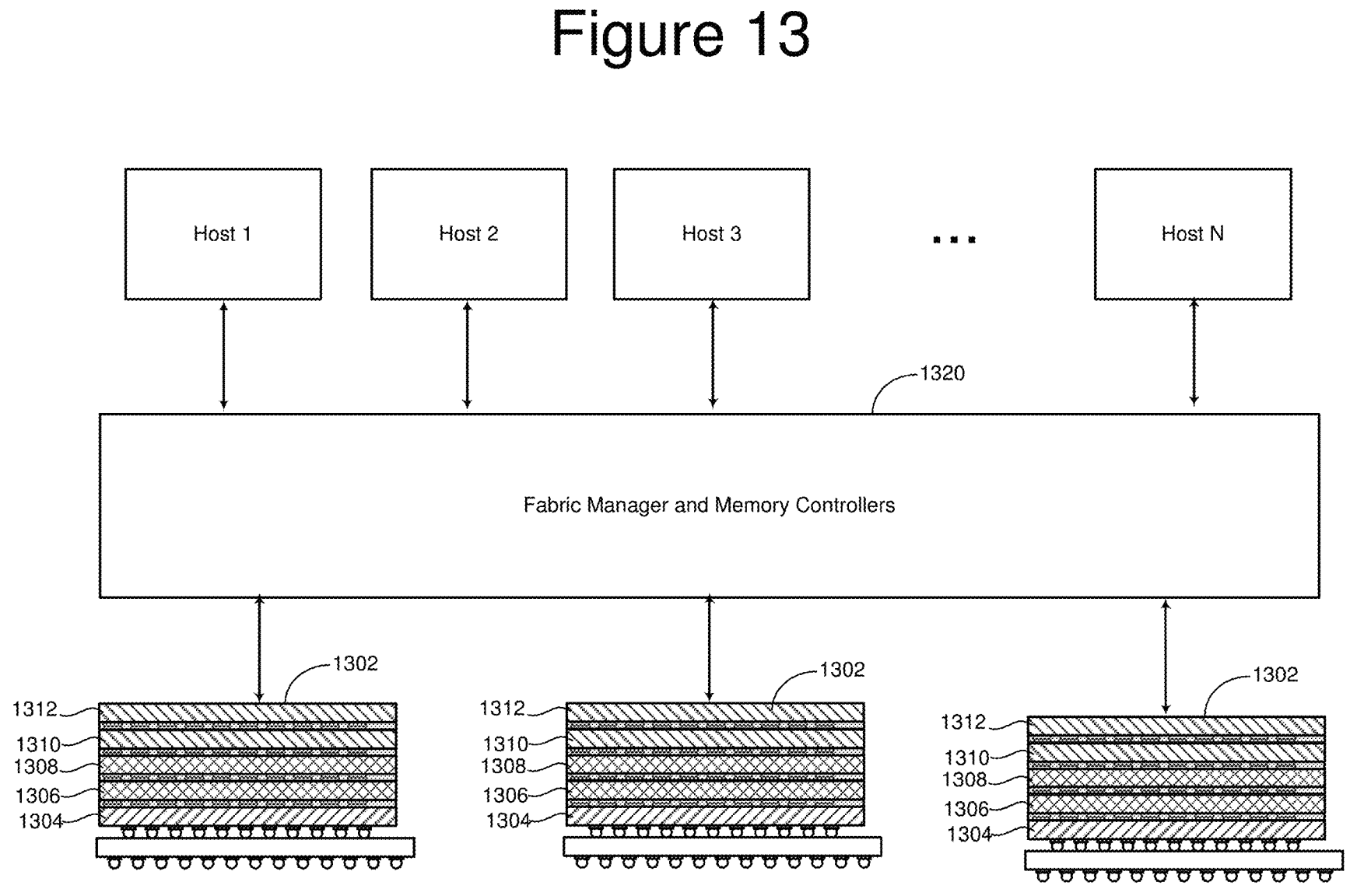
Figure 14:
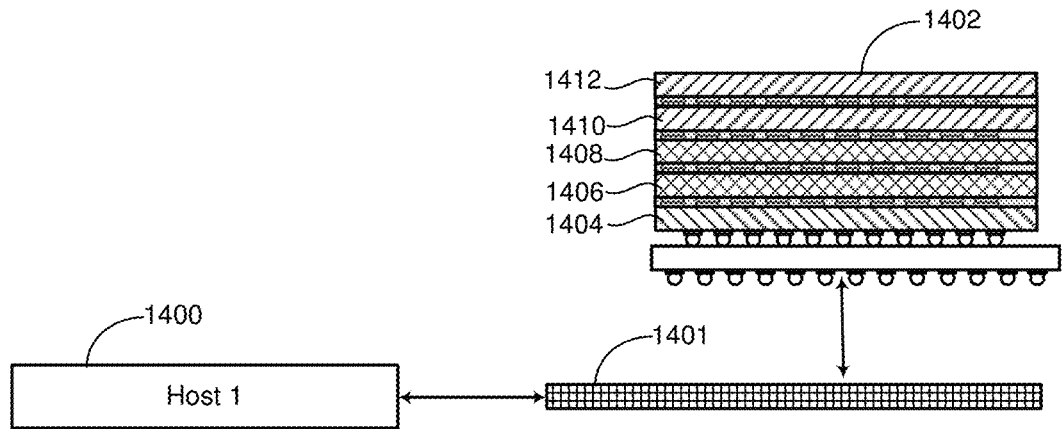
FIG. 14 is a block diagram of integrated NAND dies, MRAM dies, and control dies each in communication with memory controllers for supporting separate hosts.
Figure 14:
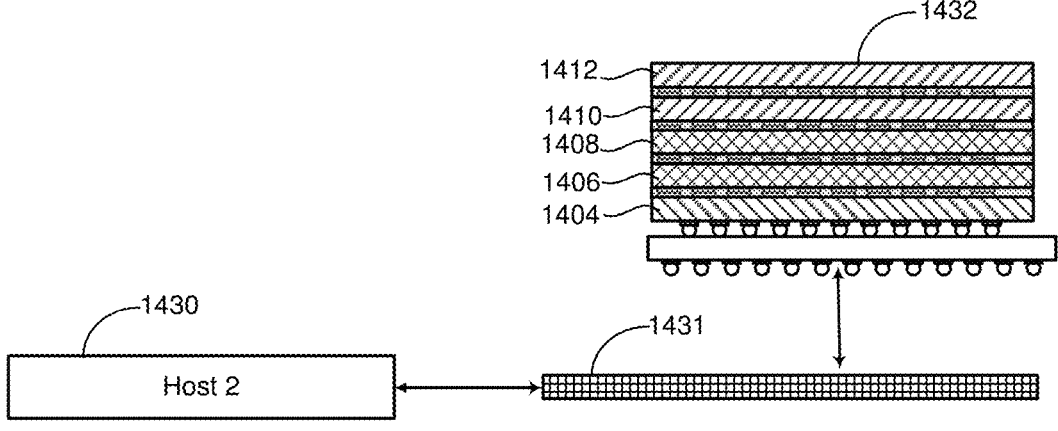

FIGS. 12-14 depict various use cases for the various embodiments discussed above. FIG. 12 is a block diagram of multiple NAND dies 1210 and 1212 (each similar to NAND die 210/512), multiple MRAM dies 1206 and 1208 (each similar to MRAM dies 208/508), a control die 1204 (similar to control die 206/506/510) and a memory controller die 1202 (implementing memory controller 1220) that are positioned in a same vertical stack, positioned in a same semiconductor package, and are in communication with a host 102 that is external to the semiconductor package.

FIG. 13 is a block diagram of integrated NAND dies, MRAM dies, and control dies in communication with a fabric manager and a plurality of Memory Controllers for supporting a plurality of hosts. For example, FIG. 13 shows multiple semiconductor packages 1302. Each package 1302 includes multiple NAND dies 1310 and 1312, multiple MRAM dies 1306 and 1308, and control die 1304, all positioned in a same vertical stack and in a same semiconductor package. Each semiconductor package 1302 is connected to and in communication with Fabric Manager and Memory Controllers 1320. FIG. 13 also depicts multiple hosts (Host 1, Host 2, Host 3, . . . Host N) that are each connected to and in communication with Fabric Manager and Memory Controllers 1320. In one embodiment, Fabric Manager and Memory Controllers 1320 comprises a plurality of memory controllers 120, a fabric and a Fabric Manager for controlling the fabric. In one embodiment, a fabric describes the network topology in which components pass data to each other through interconnecting switches. One embodiment of a fabric comprises hubs, switches, adapter endpoints, and the connecting cables that support a communication protocol between devices. In the embodiment of FIG. 13, any of the hosts can use the fabric to connect to any of the memory controllers (or any of a subset of the memory controllers) and the memory controllers can use the fabric to connect to any of the semiconductor packages 1302 (or any of a subset of the semiconductor packages 1302).

FIG. 14 is a block diagram of integrated NAND dies, MRAM dies, and control dies each in communication with separate memory controllers for supporting separate hosts. For example, FIG. 14 shows multiple semiconductor packages 1402 and 1432. Although two semiconductor packages 1402 and 1432 are depicted, more than two can be used. Each package 1402/1432 includes multiple NAND dies 1410 and 1412, multiple MRAM dies 1406 and 1408, and a control die 1404, all positioned in a same vertical stack and in a same semiconductor package. The control die is connected to a respective memory controller die 1401/1431 (implementing memory controller 120) that is external to the semiconductor package. The memory controller dies 1401 and 1431 are connected to respective hosts 1400 and 1430. For example, control die 1404 of semiconductor package 1402 is connected to memory controller die 1401, which is connected to host 1 (1400); and control die 1404 of semiconductor package 1432 is connected to memory controller die 1431, which is connected to host 2 (1430).

In the structures of FIGS. 12-14, the hosts communicate with the memory controllers using a CXL interface (and/or PCIe interface), with a high speed parallel data transfer. In some embodiments, the interface between the memory controller and the control die is a CXL interface or a Toggle Mode Interface.

FIG. 15 is a flow chart describing one embodiment of a process for operating the memory systems described herein. That is, the process of FIG. 15 can be performed by any of the embodiments discussed above, including the structures of FIGS. 1, 2A-C, 3, 4A, 4B, and 5-14. In step 1502 of FIG. 15, the one or more control circuits operate one or more MRAM die comprising a MRAM structure as a cache for one or more NAND die (where the NAND die comprises a plurality of NAND strings). In step 1504, the one or more control circuits operate the one or more MRAM die to provide long term data storage for data not cached for the one or more NAND die. In one embodiment, steps 1502 and 1504 are performed at different times, at multiple times and in any order. In step 1506, the one or more control circuits switch between operating the one or more MRAM die as a cache for the one or more NAND die and operating the one or more MRAM die to provide long term data storage for data not cached for the one or more NAND die. In response to the switching of step 1506, in step 1510 the one or more control circuits send signal(s) to one or more MRAM die and one or more NAND die indicating whether the system is operating the one or more MRAM die as a cache for the one or more NAND die or operating the one or more MRAM die to provide long term data storage. Step 1512 includes communicating directly between the one or more MRAM die and the one or more NAND die when operating the one or more MRAM die as a cache for the one or more NAND die. Step 1514 includes refraining from (or otherwise not) communicating directly between the one or more MRAM die and the one or more NAND die when operating the one or more MRAM die to provide long term data storage.

A memory system has been proposed that comprises a monolithic integration of one or more NAND dies, one or more MRAM dies and one or more control dies positioned in a same semiconductor package for high speed and high density non-volatile data storage.

One embodiment includes a non-volatile storage system, comprising: a NAND die comprising a plurality of NAND strings; a magnetoresistive random-access memory (MRAM) die comprising a MRAM structure; and a first control die comprising one or more control circuits connected to the NAND die and the MRAM die. The NAND die, the MRAM die and the first control die are positioned in a same semiconductor package.

One embodiment includes a non-volatile storage system, comprising: a plurality of NAND dies, each comprising a plurality of NAND strings; a plurality of MRAM dies, each comprising a MRAM structure; a first control die comprising one or more control circuits connected to the NAND dies; and a second control die comprising one or more control circuits connected to the MRAM dies. The control circuits of the first control die are configured to control programming and reading for the NAND strings of the plurality of NAND dies. The first control die includes a data buffer for the NAND strings of the plurality of NAND dies. The control circuits of the second control die are configured to control programming and reading for the MRAM structures of the plurality of MRAM dies. The NAND dies, the MRAM dies, the first control die and the second control die are positioned in a same semiconductor package.

One embodiment includes a method of operating non-volatile storage, comprising: operating a MRAM die comprising a MRAM structure as a cache for a NAND die comprising a plurality of NAND strings; operating the MRAM die to provide long term data storage for data not cached for the NAND die; and switching between operating the MRAM die as a cache for the NAND die and operating the MRAM die to provide long term data storage for data not cached for the NAND die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage system, comprising:

a NAND die comprising a plurality of NAND strings;

a magnetoresistive random-access memory (MRAM) die comprising a MRAM structure, the MRAM die is configured to operate in two modes, in a first mode the MRAM die is configured to operate as a cache for the NAND die, in a second mode the MRAM die is configured provide long term data storage for data not stored in the NAND die; and a first control die comprising one or more control circuits connected to the NAND die and the MRAM die;

the NAND die, the MRAM die and the first control die are positioned in a same semiconductor package.

2. The non-volatile storage system of claim 1, wherein:

the MRAM die is directly electrically connected to the NAND die to transfer data between the MRAM die and the NAND die.

3. A non-volatile storage system, comprising:

a NAND die comprising a plurality of NAND strings;

a magnetoresistive random-access memory (MRAM) die comprising a MRAM structure, the MRAM die is configured to operate as a cache for the NAND die and to provide long term data storage;

a first control die comprising one or more control circuits connected to the NAND die and the MRAM die such that the NAND die, the MRAM die and the first control die are positioned in a same semiconductor package; and a signal from the first control die to the NAND die and the MRAM die indicating whether the MRAM die is operating as a cache for the NAND die or providing long term data storage.

4. A non-volatile storage system, comprising:

a NAND die comprising a plurality of NAND strings;

a magnetoresistive random-access memory (MRAM) die comprising a MRAM structure, the MRAM die is configured to operate as a cache for the NAND die and to provide long term data storage;

a first control die comprising one or more control circuits connected to the NAND die and the MRAM die such that the NAND die, the MRAM die and the first control die are positioned in a same semiconductor package; and an electrical connection between the MRAM die and the NAND die, the MRAM die and the NAND die are configured to directly communicate with each other via the electrical connection when the MRAM die is configured to operate as a cache for the NAND die, the MRAM die and the NAND die are configured to not directly communicate with each other via the electrical connection when the MRAM die is providing long term data storage.

5. The non-volatile storage system of claim 1, wherein:

the first control die is configured to control programming and reading for the MRAM structure and the NAND strings.

6. The non-volatile storage system of claim 1, further comprising:

a second control die directly connected to the MRAM die, the first control die is configured to control programming and reading for the NAND strings, the second control die is configured to control programming and reading for the MRAM structure, the first control die and the second control die both include an interface to communicate with one or more memory controllers separate from the first control die and the second control die, the first control die includes a data buffer for the NAND strings, the second control die includes a data buffer for the MRAM structure, the second control die positioned in the same semiconductor package.

7. The non-volatile storage system of claim 6, further comprising:

additional MRAM dies positioned in the same semiconductor package, each having an additional MRAM structure and each connected to the second control die; and additional NAND dies positioned in the same semiconductor package, each having additional NAND strings and each connected to the first control die.

8. The non-volatile storage system of claim 6, further comprising:

a memory controller positioned in the same semiconductor package, connected to the first control die and connected to the second control die.

9. The non-volatile storage system of claim 1, further comprising:

a second control die directly connected to the MRAM die, the first control die is configured to control programming and reading for the NAND strings, the second control die is configured to control programming and reading for the MRAM structure, the first control die and the second control die both include an interface to communicate with one or more memory controllers separate from the first control die and the second control die, the first control die includes a data buffer for the NAND strings, the second control die includes a data buffer for the MRAM structure, the second control die positioned in the same semiconductor package; and an electrical connection between the MRAM die and the NAND die, the MRAM die and the NAND die are configured to directly communicate with each other via the electrical connection when the MRAM die is configured to operate as a cache for the NAND die, the MRAM die and the NAND die are configured to not directly communicate with each other via the electrical connection when the MRAM die is providing long term data storage.

10. The non-volatile storage system of claim 1, further comprising:

additional MRAM dies positioned in the same semiconductor package, each having an additional MRAM structure and each connected to the first control die; and additional NAND dies positioned in the same semiconductor package, each having additional NAND strings and each connected to the first control die.

11. The non-volatile storage system of claim 1, further comprising:

a memory controller positioned in the same semiconductor package and connected to the first control die, the memory controller is separate from the first control die.

12. The non-volatile storage system of claim 1, wherein:

the NAND die includes multiple planes; and the MRAM die includes multiple planes such that each plane of the MRAM die acts as a cache for a vertically aligned plane of the NAND die when the MRAM die is configured to operate as a cache for the NAND die.

13. The non-volatile storage system of claim 1, wherein:

the NAND die, the MRAM die and the first control die are positioned in a single stack encased within the same semiconductor package.

14. The non-volatile storage system of claim 1, wherein:

the NAND die, the MRAM die and the first control die are encapsulated in a molding compound forming the semiconductor package.

15. The non-volatile storage system of claim 1, wherein:

the one or more control circuits are configured to connect to a memory controller that is physically separate from the control die;

the NAND die, the MRAM die and the first control die are encapsulated in a protective housing forming the semiconductor package; and the semiconductor package includes an interface to the memory controller.

\* \* \* \* \*